(12) United States Patent
Bloomquist

(10) Patent No.: US 6,747,335 B1
(45) Date of Patent: Jun. 8, 2004

(54) MAGNETIC MEMORY CELL

(75) Inventor: Darrel R. Bloomquist, deceased, late of Meridian, ID (US), by Judy Bloomquist, legal representative

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/355,787

(22) Filed: Jan. 31, 2003

(51) Int. Cl.[7] ................................................ H01L 29/00
(52) U.S. Cl. ........................ 257/537; 257/537; 257/427
(58) Field of Search ................................. 257/537, 427, 257/665, 154, 364, 459; 365/171, 173, 158

(56) References Cited

U.S. PATENT DOCUMENTS

| | | | |
|---|---|---|---|
| 5,640,343 A | * | 6/1997 | Gallagher et al. .......... 365/171 |
| 6,400,600 B1 | | 6/2002 | Nickel et al. |
| 6,456,525 B1 | | 9/2002 | Perner et al. |
| 6,480,411 B1 | * | 11/2002 | Koganei ..................... 365/158 |

* cited by examiner

*Primary Examiner*—David Nelms
*Assistant Examiner*—Thinh T Nguyen

(57) ABSTRACT

A memory cell includes a magnetic data storage layer, a magnetic reference layer, and an insulating layer between the data storage layer and the reference layer. A resistive layer having a known electrical resistance is positioned adjacent the insulating layer.

15 Claims, 3 Drawing Sheets

MAGNETIC MEMORY CELL

BACKGROUND OF THE INVENTION

One type of nonvolatile memory device known in the art relies on magnetic memory cells. Referred to as magnetic random access memory (MRAM) devices, these devices include an array of magnetic memory cells. The magnetic memory cells used in an MRAM device may be of several different types. For example, a tunneling magnetic junction (TMJ) memory cell or a giant magnetoresistive (GMR) memory cell.

A typical magnetic memory cell includes a layer of magnetic film in which the orientation of magnetization is alterable and a layer of magnetic film in which the orientation of magnetization is fixed or "pinned" in particular direction. The magnetic film having alterable orientation of magnetization may be referred to as a data storage layer and the magnetic film having an orientation of magnetization which is pinned may be referred to as a reference layer. The data storage layer and the reference layer are separated by a layer of insulating material.

In an MRAM device, conductive traces (commonly referred to as word lines and bit lines, or collectively as write lines) are routed in a matrix across a plurality of memory cells. Word lines extend along rows of the memory cell array, and bit lines extend along columns of the memory cell array. A memory cell is located at each intersection of a word line and a bit line.

Each memory cell stores a bit of information as an orientation of magnetization. Typically, the orientation of magnetization in the data storage layer aligns along an axis of the data storage layer that is commonly referred to as its easy axis. In a "parallel" orientation, the magnetic fields of the data storage layer and the reference layer point in the same direction. In an "anti-parallel" orientation, the magnetic fields of the data storage layer and the reference layer point in opposite directions. External magnetic fields are applied to flip the orientation of magnetization in the data storage layer along its easy axis to either a parallel or anti-parallel orientation with respect to the orientation of magnetization in the reference layer, depending on the desired logic state. The orientation of magnetization of each memory cell will thus assume one of two stable orientations at any given time. These two stable orientations, parallel and anti-parallel, represent logic values of "1" and "0", respectively.

The orientation of magnetization of a selected memory cell may be changed by supplying currents to the word line and bit line intersecting at the selected memory cell. The currents in the word and bit lines create magnetic fields that, when combined switch the orientation of magnetization of the selected memory cell from parallel to anti-parallel or vice versa. Additionally, the write lines can be used to read the logic values stored in the memory cell.

One problem which exists for MRAM devices using magnetic memory cells like those described above is the occasional presence of a defective memory cell. In particular, the insulating layer of a memory cell may include defects which cause the nominal resistance of the affected memory cell to drop several orders of magnitude lower than the resistance of a properly functioning memory cell. The insulating layer is typically the only non-conductive material in the memory cell stack. Thus, defects such as foreign conductive material particles in the insulating layer, pin holes through the insulating layer, or a too-thin insulating layer resulting from poor material deposition processes during the formation of the memory cell, may result in a memory cell resistance which is unacceptably low.

Because data in a memory cell is written and read by passing electrical currents through the write lines that intersect the memory cell, a memory cell having a nominal resistance which differs substantially from the resistance of a properly functioning memory cell will affect the currents (and thus magnetic fields) intended to write or read data in the memory cell. The low resistance memory cell is effectively rendered unusable. In addition, in the absence of switches or diodes to isolate one memory cell from another, the low resistance memory cell appears essentially as a short-circuit between the word and bit lines which intersect at the defective memory cell. As a result, all other memory cells along the word and bit line of the defective memory cell are also affected and possibly rendered unusable. This can have a significant negative impact on the storage capacity of the memory array.

Currently, in the absence of switches or diodes to isolate one memory cell from another, there is no effective way to repair a defective memory cell exhibiting low nominal resistance, or limit its detrimental effects on other memory cells sharing a common word and/or bit line in the memory array. Although switches or diodes may be added to an MRAM device to isolate one memory cell from another, such a process adds cost and complexity to the device.

SUMMARY OF THE INVENTION

A memory cell which limits or eliminates the detrimental effects of a low nominal resistance memory cell on an array of memory cells in an MRAM device is described herein. One embodiment of a memory cell according to the invention includes a magnetic data storage layer, a magnetic reference layer, and an insulating layer between the data storage layer and the reference layer. A resistive layer having a known electrical resistance is positioned adjacent the insulating layer.

DETAILED DESCRIPTION

In the following detailed description, reference is made to the accompanying drawings which form a part hereof, and in which is shown by way of illustration specific embodiments in which the invention may be practiced.

Figure 1A:
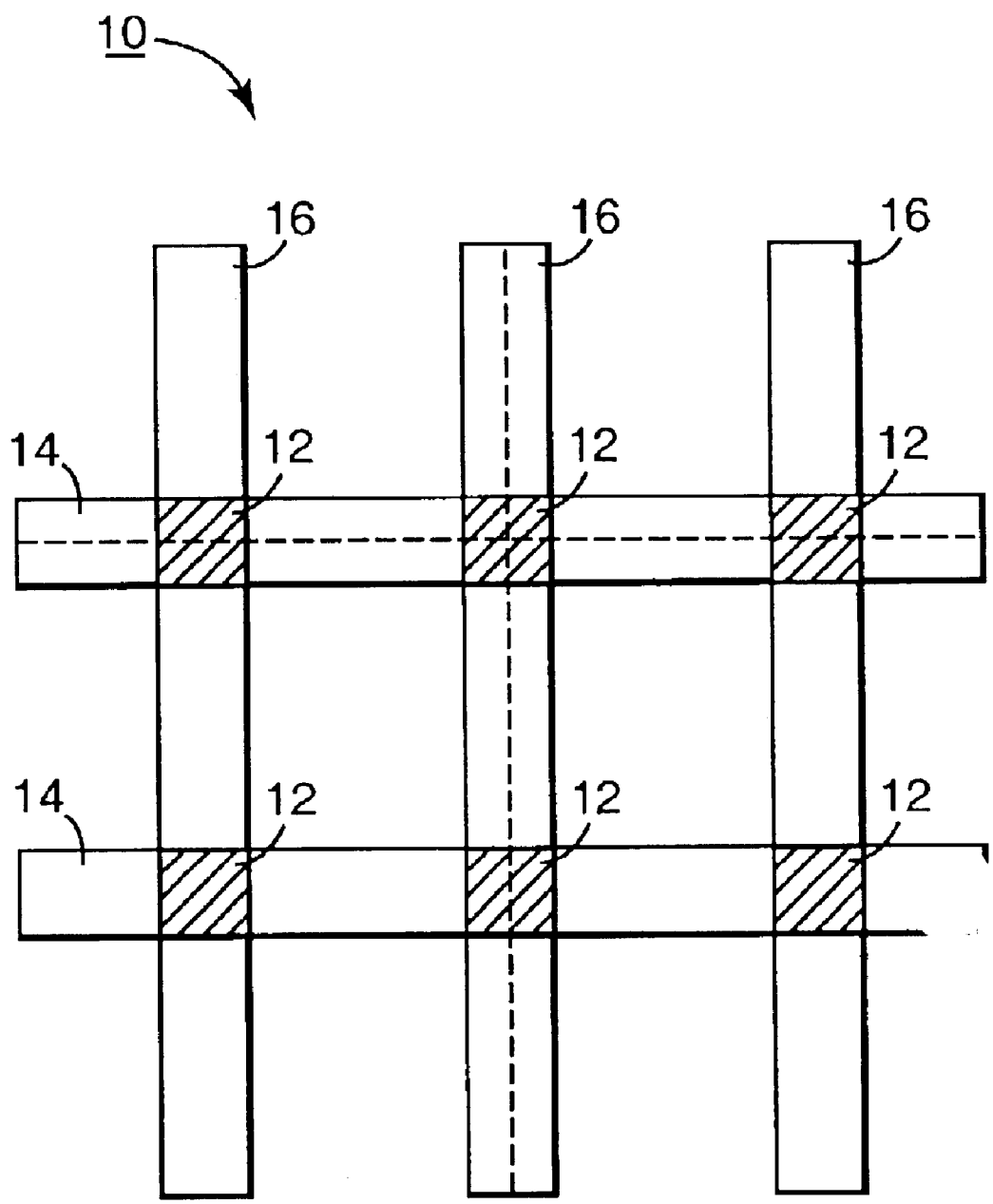
FIGS. 1a and 1b are top and perspective views, respectively, of a prior art magnetic random access memory array.
Figure 1B:
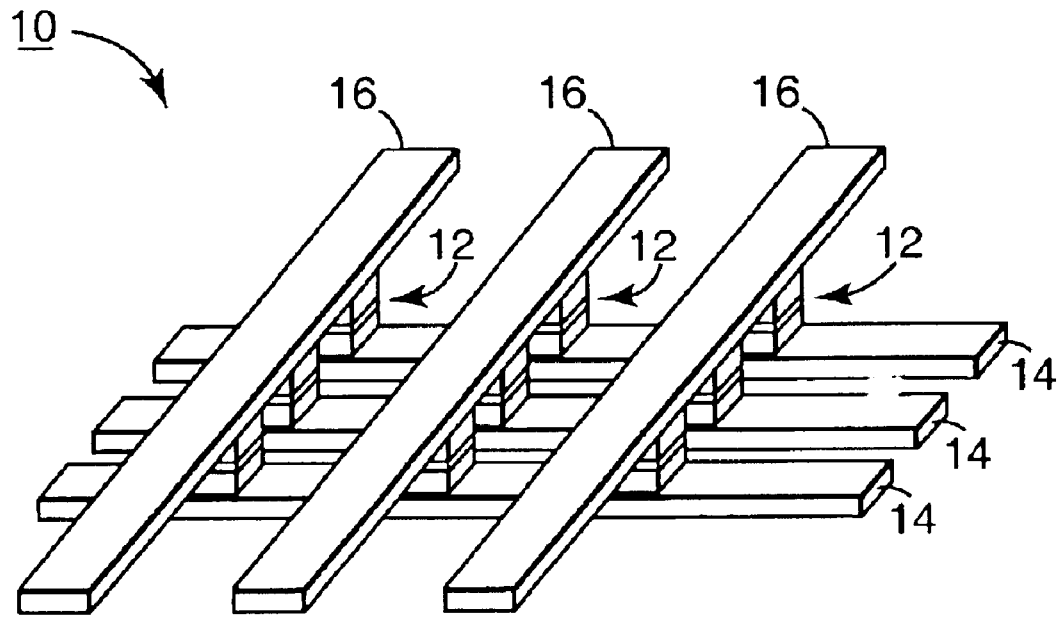

FIGS. 1a and 1b illustrate a simplified prior art MRAM array 10. The array 10 includes memory cells 12, word lines 14, and bit lines 16. Word lines 14 and bit lines 16 ate collectively referred to herein as write lines. The memory cells 12 are positioned at each intersection of a word line 14 with a bit line 16, and are positioned between the write lines 14, 16, as more clearly seen in FIG. 1b.

Figure 2:
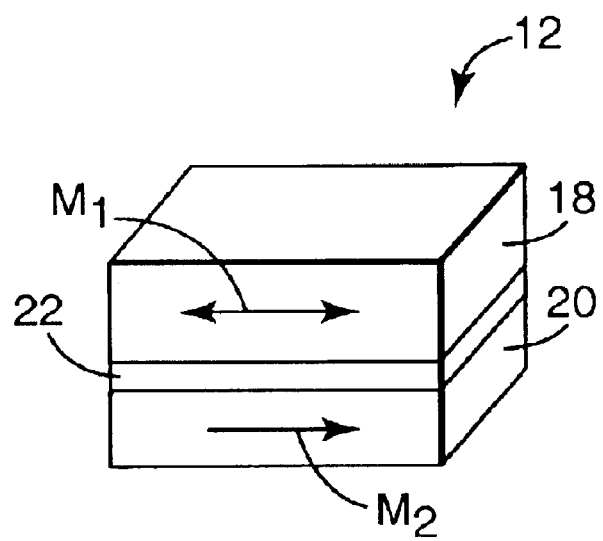
FIG. 2 is perspective view of a prior art magnetic random access memory cell illustrating the orientations of magnetization of data storage and reference magnetic film layers.

FIG. 2 illustrates a single memory cell 12 from FIGS. 1a and 1b, and shows how a bit of data is stored in the memory cell 12. As can be seen in FIG. 2, the memory cell 12 includes a data storage layer 18 having an alterable orientation of magnetization $M_1$ which can assume either of two stable orientations, and a reference layer 20 having a fixed or pinned orientation of magnetization $M_2$. The data storage layer 18 and reference layer 20 are separated by an insulating layer 22. The data storage layer 18 rotates its orientation of magnetization $M_1$ in response to electrical currents applied to the write lines 14, 16 (not shown in FIG. 2) during a write operation to the memory cell 12.

A first logic state stored in memory cell 12 is indicated when the orientations of magnetization $M_1$ and $M_2$ are parallel to each other. For instance, when orientations of magnetization $M_1$ and $M_2$ are parallel a logic "1" state is stored in the memory cell 12. A second logic state is indicated when orientations of magnetization $M_1$ and $M_2$ are anti-parallel to each other. Thus, when orientations of magnetization $M_1$ and $M_2$ are anti-parallel a logic "0" state is stored in the memory cell 12. It should be noted that although FIG. 2 illustrates the data storage layer 18 positioned above the reference layer 20, the reference layer 20 can alternately be positioned above the data storage layer 18.

The resistance of the memory cell 12 differs according to the relative orientations of $M_1$ and $M_2$. When orientations of magnetization $M_1$ and $M_2$ are anti-parallel, i.e., the logic "0" state, the resistance of the memory cell 12 is at its highest. On the other hand, the resistance of the memory cell 12 is at its lowest when the orientations of magnetization $M_1$ and $M_2$ are parallel, i.e., the logic "1" state. As a consequence of the differing resistances of the parallel and anti-parallel states, the logic state of the data bit stored in the memory cell 12 can be determined by measuring its resistance. The resistance of the memory cell 12 may be measured using write lines 14, 16.

As described above, it is important that each memory cell 12 in an MRAM device have a nominal resistance that is close to the design value of a properly-functioning memory cell. A memory cell 12 having a nominal resistance that is sufficiently lower than the design value, such that the logic state of the memory cell 12 is impossible to determine, is referred to herein as a defective memory cell 12. The difference in resistance between a memory cell's parallel and anti-parallel states is relatively small, so when a memory cell 12 has a nominal resistance lower than the design value, it becomes very difficult or impossible to accurately determine the logic state of the memory cell 12. More importantly, in the absence of switches or diodes to isolate one memory cell 12 from another in an MRAM device, a defective memory cell 12 will also render unusable all other memory cells 12 which share a common word line 14 or bit line 16 with the defective memory cell 12.

As noted above, a defective memory cell 12 may result from defects in the insulating layer 22 of a memory cell 12. The nominal resistance of a memory cell 12 may drop lower than the resistance of a properly functioning memory cell, for example, if insulating layer 22 is too thin, or is contaminated with conductive material particles, or has pinholes through the insulating layer 22. It is contemplated that individuals skilled in the art will recognize additional situations or circumstances which could result in a reduction in the resistance across insulating layer 22 and thus result in a defective memory cell 12. No matter what the cause of a resistance reducing defect in a memory cell 12, it is desirable to eliminate or reduce the detrimental effects of the defective memory cell 12 on other memory cells 12 in the MRAM device.

Figure 3:
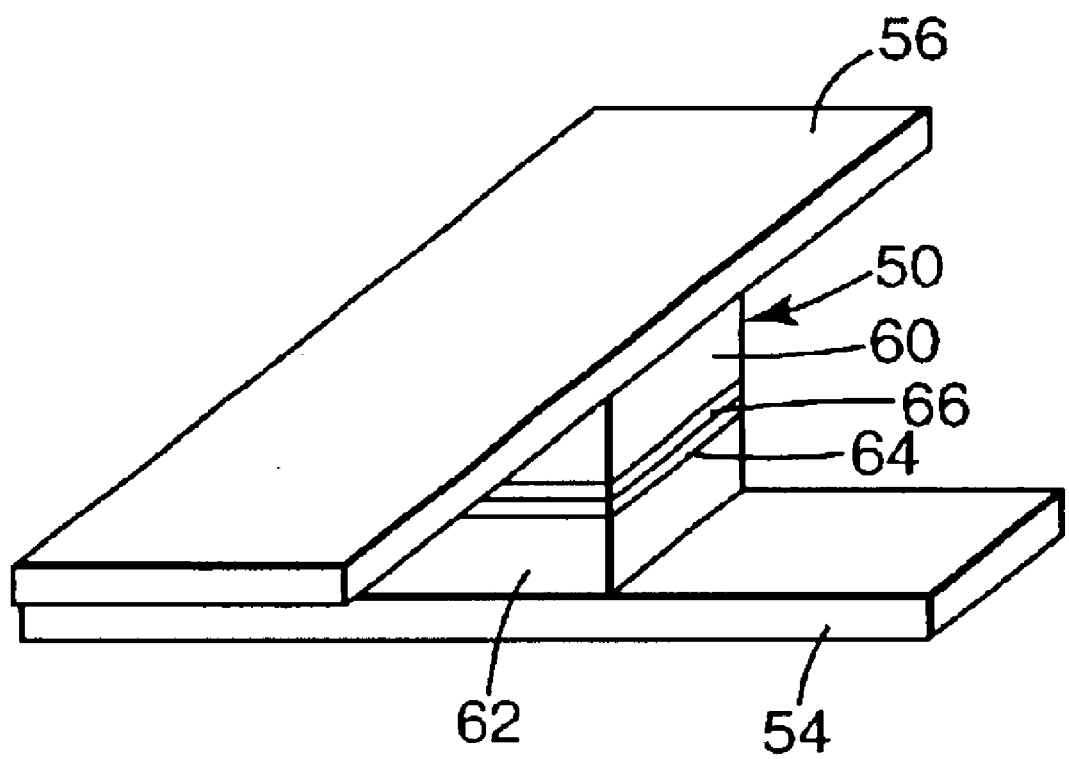
FIG. 3 is a perspective view of one embodiment of a magnetic memory cell according to the invention in a magnetic random access memory array.

FIG. 3 illustrates one embodiment of a single memory cell 50 of an MRAM device according to the present invention. In practice, the single memory cell 50 is only one of a plurality of memory cells in an array of similar memory cells.

Memory cell 50 includes a data storage layer 60, a reference layer 62, and an insulating layer 64 which acts as a tunnel barrier between the data storage layer 60 and the reference layer 62. The data storage layer 60 and reference layer 62 may be formed from ferromagnetic materials such as, for example, nickel iron (NiFe), or iron oxide ($Fe_3O_4$), or chromium oxide ($CrO_2$), or cobalt alloys (e.g., CoFe or NiCoFe), or other suitable ferromagnetic materials and alloys known to individuals skilled in the art. Insulating layer 64 may be formed from, for example, a material such as aluminum oxide ($Al_2O_3$), silicon dioxide ($SiO_2$), tantalum oxide ($Ta_2O_5$), silicon nitride ($SiN_4$), or other suitable dielectric materials known to those individuals skilled in the art.

The above-described structure of a magnetic memory cell 50 may be referred to as a spin-tunneling device, in that an electrical charge migrates through the insulating layer 64 during read operations. This electrical charge migration through the tunnel barrier is due to a phenomenon known as spin-tunneling and occurs when a read voltage is applied across the magnetic memory cell 50. A spin-tunneling device is one type of giant magneto-resistive (GMR) structure. In alternate embodiments according to the invention, the memory cell may be any type of giant magneto-resistive (GMR) structure.

An intermediate resistive layer 66 having a known electrical resistance is positioned between data storage layer 60 and reference layer 62. Although resistive layer 66 is shown in FIG. 3 positioned between insulating layer 64 and data storage layer 60, resistive layer 66 may be positioned on either side of insulating layer 64. In an alternate embodiment, resistive layer may be simultaneously positioned on both sides of insulating layer 64 In one embodiment according to the invention, resistive layer 66 is patterned in a manner similar to data storage layer 60 and reference layer 62 such that each memory cell 50 includes an individual resistive layer 66. In another embodiment, resistive layer 66 may continuously span a plurality of memory cells, up to and including all of the memory cells 50 in the MRAM device.

In one embodiment according to the invention, resistive layer 66 is a thin film resistor that enables electrons to preferentially spin scatter. The particular material selected to form resistive layer 66 will depend upon the resistance requirements of the system and the manufacturing process used to create the memory cell 50. Examples of materials which may be used to form resistive layer include, but are not limited to, semiconductor materials (e.g., silicon, carbon, germanium, indium telluride, antimony telluride), dielectric materials (e.g., silicon oxide, silicon nitride, aluminum oxide), semiconductor-metal alloys (e.g., silicon-tantalum), dielectric-metal composites (e.g., aluminum oxide-gold), and polymer materials.

The presence of resistive layer 66 increases the reliability of read and write operations in the MRAM device. If insulating layer 64 of memory cell 50 is defective and is effectively short-circuited, the resistance across memory cell 50 will be approximately equal to the resistance of resistive layer 66. In addition, the current passing through the defective memory cell 50 will be limited by the resistive layer 66. If the resistance value of resistive layer 66 is sufficiently large, the short-circuit current will be limited to a relatively small value compared to the write line currents, so that the current flowing through the short-circuit will not adversely affect the write line currents (and thus read and write operations). In one embodiment according to the invention, resistive layer 66 has a resistance of the same order of magnitude as the resistance of a properly-functioning memory cell 50. In another embodiment according to the invention, resistive layer 66 has a resistance of approximately 10% or more of the resistance of a properly-functioning memory cell 50 in the MRAM array.

Memory cells 50 sharing common write lines 54, 56 with the short-circuited memory cell 50 may continue to be used for storing data in the MRAM array. By adjusting the read and write currents in the write lines 54, 56 which intersect the short-circuited memory cell 50, the reduced-but-known resistance of short-circuited memory cell 50 may be accommodated. Such adjustments may be made, for example, in the software which interrogates the memory cells 50 to determine their logic values.

Resistive layer 66 thus limits effects of a memory cell failure to the single defective memory cell 50. Without a resistive element of some type between intersecting write lines (e.g., a properly-functioning memory cell 50 or resistive layer 66 as described herein), large portions of the read and write currents would be diverted to the short-circuited memory cells 50 and incorrect data could be read from or written to those memory cells sharing a common write line with the shorted memory cell 50.

The memory cell 50 may be formed using known or later developed semiconductor fabrication and magnetic film processing techniques including material deposition techniques, photolithography, masking and etching.

What is claimed is:

1. A memory cell comprising:
   a magnetic data storage layer;
   a magnetic reference layer;
   an insulating layer between the data storage layer and the reference layer; and
   a resistive layer having a known electrical resistance positioned adjacent the insulating layer.

2. The memory cell of claim 1, wherein the resistive layer is a thin film resistor.

3. The memory cell of claim 1, wherein the resistive layer has a resistance of approximately 10% or more of the resistance of a properly-functioning memory cell.

4. The memory cell of claim 1, wherein the resistive layer has a resistance of the same order of magnitude of the resistance of a properly-functioning memory cell.

5. The memory cell of claim 1, wherein the resistive layer is a semiconductor material.

6. The memory cell of claim 1, wherein the resistive layer is a dielectric material.

7. The memory cell of claim 1, wherein the resistive layer is a semiconductor-metal alloy.

8. The memory cell of claim 1, wherein the resistive layer is a dielectric-metal composite.

9. The memory cell of claim 1, wherein the resistive layer enables electrons to preferentially spin scatter.

10. A data storage device comprising:
    a plurality of magnetic memory cells each having a data storage layer, a reference layer and an insulating layer between the data storage layer and the reference layer; and
    a resistive layer having a known electrical resistance positioned adjacent the insulating layer of each memory cell.

11. The data storage device of claim 10, wherein the resistive layer continuously spans more than one of the plurality of memory cells.

12. The data storage device of claim 10, wherein the resistive layer has a resistance of approximately 10% or more of the resistance of a properly-functioning memory cell.

13. The data storage device of claim 10, wherein the memory cells are spin tunneling devices.

14. The data storage device of claim 10, wherein the memory cells are giant magneto-resistive devices.

15. The data storage device of claim 10, wherein the resistive layer enables electrons to preferentially spin scatter.

* * * * *